United States Patent
Chow et al.

(10) Patent No.: US 7,057,969 B2
(45) Date of Patent: Jun. 6, 2006

(54) SELF-TIMED SNEAK CURRENT CANCELLATION

(75) Inventors: David GenLong Chow, Los Altos, CA (US); Hans Ola Dahl, Stange (NO)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/100,866

(22) Filed: Apr. 6, 2005

(65) Prior Publication Data

US 2005/0174848 A1    Aug. 11, 2005

Related U.S. Application Data

(62) Division of application No. 10/035,878, filed on Dec. 24, 2001, now Pat. No. 6,914,839.

(51) Int. Cl.
| | |
|---|---|
| *G11C 8/00* | (2006.01) |
| *G11C 7/06* | (2006.01) |
| *G11C 5/14* | (2006.01) |
| *G11C 7/02* | (2006.01) |

(52) U.S. Cl. ............ 365/233; 365/189.07; 365/189.09; 365/207

(58) Field of Classification Search ................ 365/233, 365/189.07, 189.09, 207
See application file for complete search history.

(56) References Cited

U.S. PATENT DOCUMENTS

| | | | | |
|---|---|---|---|---|
| 3,911,746 | A | * 10/1975 | Spangler et al. | ............. 374/183 |
| 4,034,233 | A | * 7/1977 | Leyde | ........................ 700/295 |
| 4,045,658 | A | 8/1977 | Peltola et al. | |
| 4,369,501 | A | 1/1983 | Brown et al. | |
| 4,724,545 | A | * 2/1988 | Hamada | ..................... 455/218 |
| 4,843,295 | A | 6/1989 | Thompson et al. | |
| 5,268,872 | A | * 12/1993 | Fujii et al. | ............. 365/189.07 |
| 5,361,175 | A | * 11/1994 | Richardson et al. | .......... 360/46 |
| 5,708,616 | A | * 1/1998 | Choi | ......................... 365/205 |
| 5,769,873 | A | 6/1998 | Zadeh | |
| 6,055,180 | A | 4/2000 | Gudesen et al. | |
| 6,072,742 | A | * 6/2000 | Ooishi | ........................ 365/226 |
| 6,205,078 | B1 | * 3/2001 | Merritt | ....................... 365/226 |
| 6,307,798 | B1 | * 10/2001 | Ahmed et al. | ............. 365/207 |
| 6,370,061 | B1 | * 4/2002 | Yachareni et al. | ..... 365/185.22 |
| 6,737,871 | B1 | * 5/2004 | Schneider et al. | .......... 324/539 |

* cited by examiner

*Primary Examiner*—Huan Hoang
*Assistant Examiner*—Ly Duy Pham
(74) *Attorney, Agent, or Firm*—Marger Johnson & McCollom, PC

(57) ABSTRACT

A sensing circuit. The circuit includes an integrator to sense charge release from a passive electronic device and a comparator to interpret the charge release as one of at least two data states. The circuit also includes a compensation module to generate a compensation signal as needed and a self-timing module to adjust timing of the integrator sensing based upon a predefined voltage level.

12 Claims, 5 Drawing Sheets

SELF-TIMED SNEAK CURRENT CANCELLATION

This application is a division of prior application Ser. No. 10/035,878 filed Dec. 24, 2001 now U.S. Pat. No. 6,914,839.

BACKGROUND

1. Field

This disclosure relates to passive electronic devices, more particularly to passive electronic devices that are subjected to applied voltages.

2. Background

Passive electronic devices generally do not generate signals based upon their own internal circuits. Typically, passive devices must be addressed or requested to provide some sort of signal. One example of a passive device is a memory. Generally, memories do not provide the data stored in them until some other device, such as a processor, requests the data. Similarly, the memory receives data to store, rather than generating data to store.

In some types of passive devices, including memories, have elements being held at a potential, even though those elements may not be undergoing active addressing. Returning to the memory example, for example, a memory cell may be held at a particular potential in order to allow the cell to retain the data stored there. This potential is typically less than that required to address a cell for either reading or writing.

However, application of the voltage may cause the cell to 'leak' charge over a period of time, resulting in a low level of current. While the current created by any one element does not cause problems, when multiplied by the number of elements in the device, the current could become one. The cumulative charge over time becomes a significant current, referred to here as 'sneak' current, and results in a high level of noise in the signal.

It would be desirable for a method and apparatus that could cancel the sneak current, reducing the noise in the system utilizing the passive electronic devices.

BRIEF DESCRIPTION OF THE DRAWINGS

The invention may be best understood by reading the disclosure with reference to the drawings, wherein.

DETAILED DESCRIPTION OF THE EMBODIMENTS

Figure 1:
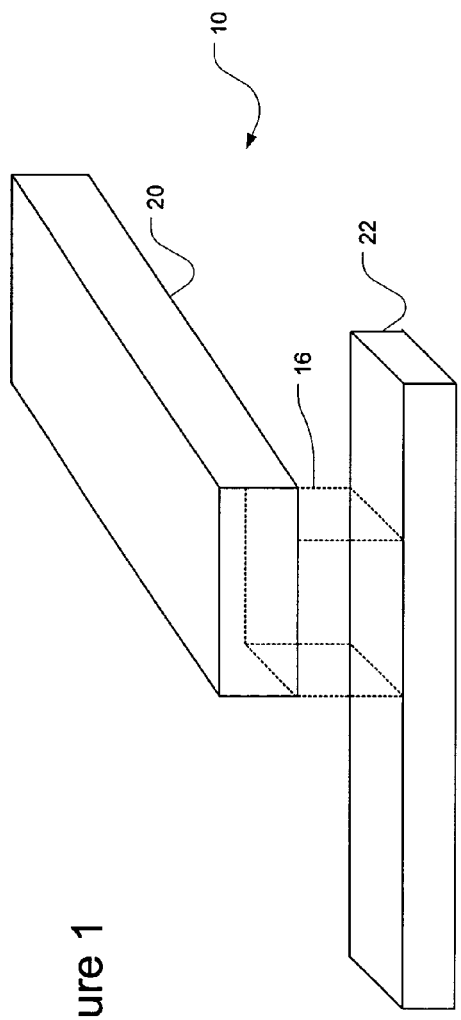
FIG. 1 shows an embodiment of a passive electronic device.

FIG. 1 shows one example of a cell in a ferroelectric memory array. The cell 10 has an electrode layer 22, a ferroelectric material layer 16 and a second electrode layer 20. This cell may be manufactured by depositing and patterning a layer of metal, depositing a polymer and then depositing and patterning another layer of metal. There are no transistors or other semiconductor elements in each cell, simplifying both the structure and the manufacturing process of these types of memories.

The electrode layers 20 and 22 are typically organized such that one forms a series of lines oriented in a first direction and the other forms a series of lines in a direction at a right angle to the first direction. Although these lines are separated by the ferroelectric material, they do cross over forming the grid of memory cells. The region of ferroelectric material 16 sandwiched between the two lines at the crossover point shown in FIG. 1 is the portion of the cell that holds the data value as will be discussed in more detail further.

Figure 2:
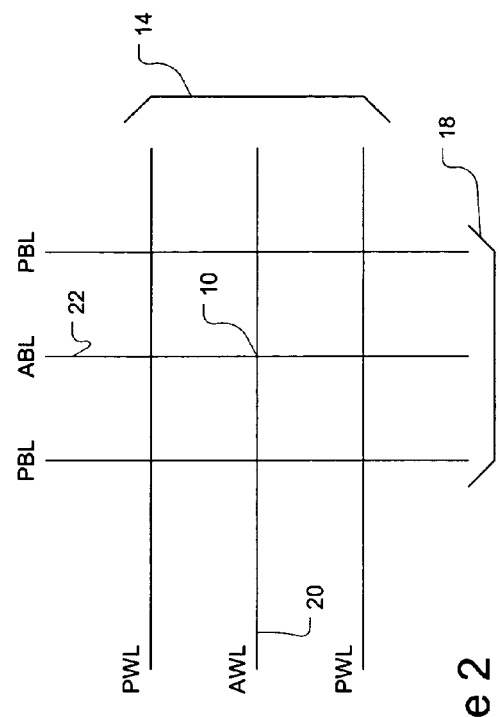
FIG. 2 shows an embodiment of an array of memory cells, in accordance with the invention.

FIG. 2 shows a portion of a memory array formed of such cells. The electrode line 20 from FIG. 1 is defined as a word line and the electrode line 22 as the bit line. The cell 10 is at the cross over point of these two lines and in this example is the active cell. The active cell for the purposes here is that cell which is being addressed in a memory operation, either a memory read or a memory write. Correspondingly, the word line 20 is defined as the active word line (AWL) and word line 22 is defined as the active bit line (ABL). The word and bit lines surrounding the active cell are referred to as passive word lines (PWL) and passive bit lines (PBL).

Figure 3:
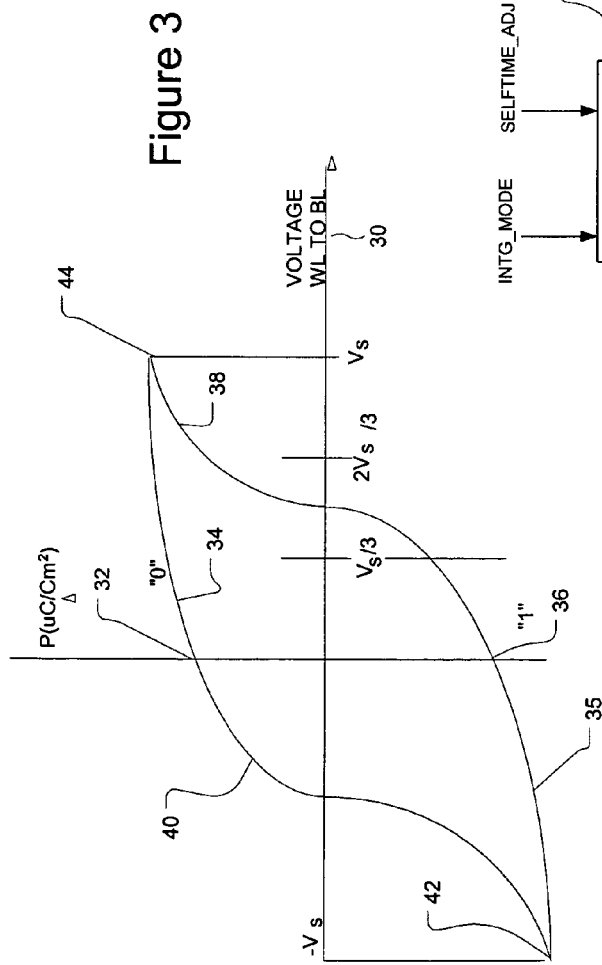
FIG. 3 shows an embodiment of a voltage versus polarization hysterisis curve, in accordance with the invention.

The data value in the cell is either a one '1' or a zero '0'. The value of the cell is determined by the polarization of the material versus the voltage being applied. Referring now to FIG. 3, a polarization versus voltage hysterisis curve demonstrates the nature of the memory cell and how it stores data values of ones or zeros. Control of the voltages applied to the active word line and active bit line may cause the material to experience a polarization shift. The differential voltage seen at the cell is referred to as the word line to bit line voltage, and is shown in the curve of FIG. 3 as the horizontal axis. The vertical axis is the polarization of the material. The origin of the axes corresponds to zero voltage and zero polarization. FIG. 3 shows a typical polarization versus voltage curve.

When a negative voltage $-V_s$ is applied to the word line 20 relative to bit line 22, the polarization versus voltage profile follows the left path 40. This occurs as the polarization of the ferroelectric material switches from positive to negative polarity. Changes in polarization take time and eventually the polarization settles at the polarization level corresponding to the negative saturation voltage $-V_s$, as shown at the bottom of the leftmost path at 42. When the magnitude of the applied voltage is reduced, shown here as being reduced to zero along path 35, the material retains a remnant polarity shown as a data value one on the vertical axis at 36.

Similarly, when a positive saturation voltage $V_s$ is applied to word line 20 relative to bit line 22, the polarization versus voltage profile follows the right side path 38, settling at the polarization level corresponding to the positive saturation voltage, as shown at the top of the rightmost path at 44. When the applied voltage is reduced, shown here as being reduced to zero along path 34, the remnant polarity shown as a data value zero on the vertical axis shown at 32.

In order to determine the current state of polarity of a cell, the saturation voltage $V_s$ is applied to the ferroelectric cell. This means that the word line to bit line voltage differential is $V_s$. This application causes a polarization shift. For the data value zero, where the cell has positive polarity at zero voltage, application of the saturation voltage produces little to no charge out. Sense amplifiers assigned to that cell detect some charge release, but not nearly as much as from cells having negative polarity at zero voltage. This lack of charge release is then manipulated to produce a data value of 'zero' for that memory cell in the read operation. However, application of the saturation voltage to the cells having negative polarity at zero voltage does cause a polarity reversal and an associated charge release. This charge release is sensed and manipulated to produce a data value of 'one' for that memory cell in the read operation.

One characteristic of this type of memory is that cells coupled to the active bit line experience a voltage potential of $V_s/3$. Referring back to FIG. 2, these are the cells between the passive word line (PWL) and the active bit line (ABL). Cells release a residual amount of charge and form a "sneak current" to the active bit line. In one embodiment of the present invention, a residual charge release in the hundredths of femtocoulombs per memory cell, is expected for propagation to the active bit line. Assuming, for example, that thousands of ferroelectric cells are tied to the active bit line and a worst case condition of each cell having a one state condition, then the combined "charge" propagated to the active bit line could be in the tenths of femtocoulombs per bitline. This charge may lead to a false reading of the memory cell, as it essentially acts as 'noise' on the line.

Figure 4:
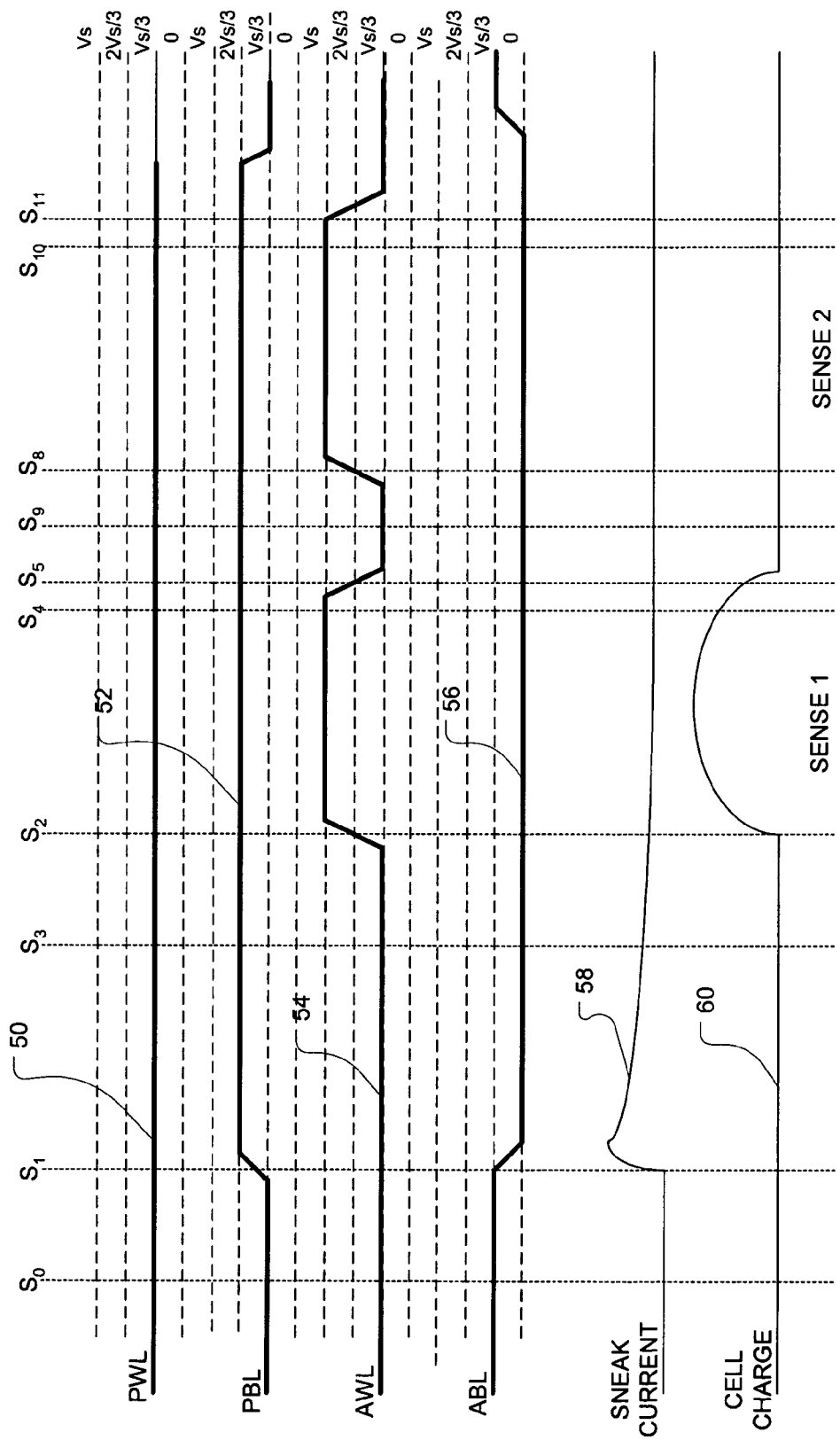
FIG. 4 shows an embodiment of a read cycle, in accordance with the invention.

A timing diagram for a read cycle is shown in FIG. 4. As can be seen, the four different types of data lines are shown on the timing diagram, being passive word lines (PWL), passive bit lines (PBL), active word lines (AWL) and active bit lines (ABL). In addition, a waveform for a sneak current and the cell charge are also shown. As can be seen, the word and bit lines are held at a potential of $V_s/3$, prior to the beginning of the cycle.

At time $S_0$, as shown in the timing diagram of FIG. 4, the word lines and bit lines receive quiescent level voltages of $V_s/3$. A sneak current 58 is then drawn from the active bit line discharging the active bit line to zero volts, as represented by waveforms 52, 56 at snapshot time $S_1$ in FIG. 4. The sneak current is produced by the PWL to ABL voltage differential of $V_s/3$. In this embodiment a bit line settling duration of $S_3-S_1$ is provided before starting a first integration interval.

After the time for the sneak current to reach a substantially linear region of its settling curve, the integration sense amplifier is enabled at snapshot time $S_3$, to begin a first integration time window. Next, the active word line is charged to a read level voltage equal to the saturation level $V_s$ as represented by waveform 54 at time $S_2$. The integrating sense amplifier provides an integration to integrate charge released from the active ferroelectric cell. Upon conclusion $S_4$ of the first integration window, a first integration value is obtained from the integration sense amplifier.

After obtaining the first integration value, the integration sense amplifier is disabled and the active word line returned to its quiescent voltage level of $V_s/3$, as represented by waveform 54 at snapshot time $S_5$. Another duration is allowed to lapse, during which the active ferroelectric cell is allowed to establish a zero state remnant polarization condition, and then the integrating sense amplifier is again enabled to start the second integration window at time $S_9$, and the active word line is driven to a read level voltage equal to the saturation level voltage $V_s$, see waveform 54 at time $S_8$. Over this second integration duration, residual charge released from the ferroelectric cell, as associated with any residual polarization alignments, is integrated by the integration sense amplifier.

At the conclusion of the second integration time window, at time $S_{10}$, a second integrated value is obtained from the sense amplifier, and the first and second integration values are compared in order to determine the initial state of the ferroelectric cell. Following the second integration time window, the active word line is returned to its quiescent level voltage $V_s/3$ as represented by waveform 54 at time $S_{11}$, and the active and passive bit lines returned to their quiescent level voltages of $V_s/3$ as represented by waveforms 56, and 52.

Figure 5:
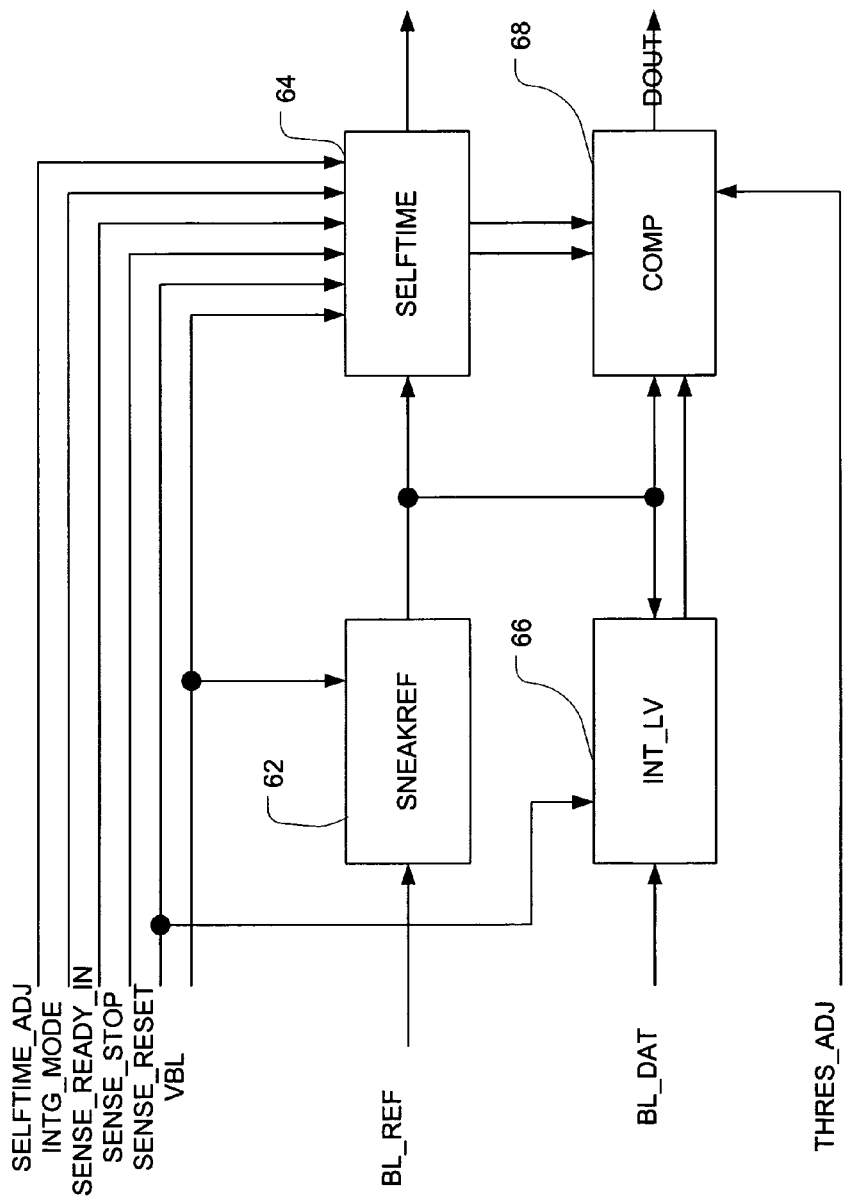
FIG. 5 shows an embodiment of a sense and interpretation circuit, in accordance with the invention.

In order to eliminate the problems associated with the sneak current, different approaches may prove useful. One such approach is shown in block diagram form in FIG. 5. In this embodiment the circuit shown in FIG. 5 is used to sense and interpret the polarization charge release from an addressed pixel during a read cycle. As part of the read cycle, the circuit provides for mitigation of the effects of the sneak current.

As can be seen in FIG. 5, the sense and interpretation circuit has four functional blocks in this embodiment. The integrator, INT_LV, 66 senses the charge release on the addressed bit line, BL_DAT. The integrator 66 produces an output voltage proportional to the charge. A comparator, COMP, 68 with a threshold voltage adjustable through THRES_ADJ interprets this voltage as a "1" or a "0," which is presented on DOUT. The integration mode signal INTG_MODE controls the timing of the integrators to handle sneak current using the SELFTIME module 64. The SELFTIME module 64 has an input of VREF, which is produced by the SNEAKREF compensation module 62. This will be discussed in more detail later.

Figure 6:
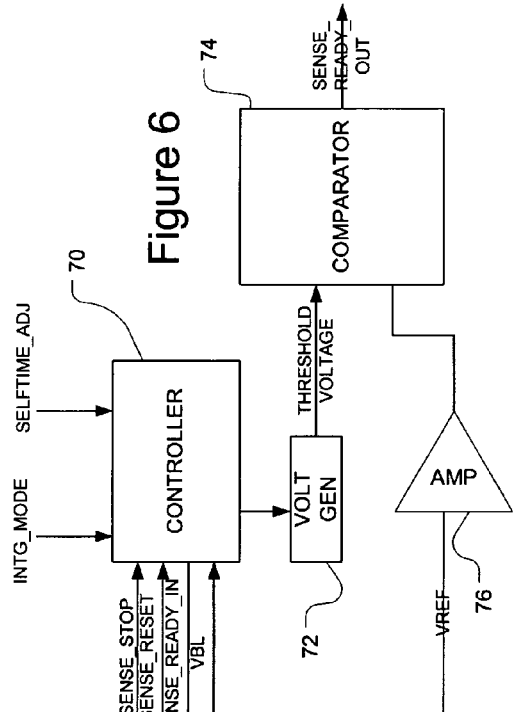
FIG. 6 shows an embodiment of a self-timing module, in accordance with the invention.

A more detailed view of an embodiment of the SELFTIME module 64 is shown in FIG. 6. The SELFTIME module has essentially two different parts. A digital part, shown as the controller 70, decodes the integration mode signal INTG_MODE and generates the corresponding control signals. An analog part determines when to stop the integration of the VREF signal used in detecting the polarization state of the addressed cell. The analog part has a threshold voltage generator 72, an amplifier or pre-amplifier 76 and a comparator 74.

The voltage generator is used to set the threshold voltage to be compared with VREF. The level of the threshold voltage will typically be determined externally using the signal SELFTIME_ADJ. However, other means of determining the threshold voltage are also possible. The voltage generator 72 then generates a voltage at this level and passes that voltage to the comparator 74. The comparator will compare the reference voltage VREF to the threshold voltage and determine when VREF has reached the predetermined threshold voltage.

VREF is the bias voltage used in the integrators, typically adjusted for sneak currents. The sneak currents are monitored on a reference bit line BL_REF and the voltage on VREF is adjusted accordingly. This signal is amplified by the amplifier 76 prior to entering the comparator 74. To sense data on BL_DATA correctly, typically zero data is written into the reference cells.

The circuit of FIG. 6 is just one embodiment of a self-timing circuit and may have several different types of integration modes. For purposes of discussion here, the integration mode discussed with reference to FIGS. 6 and 7 will be referred to as self-timing sneak current cancellation and will be designated as integration mode 00. Other integration modes are possible, but are outside the scope of this disclosure.

Figure 7:
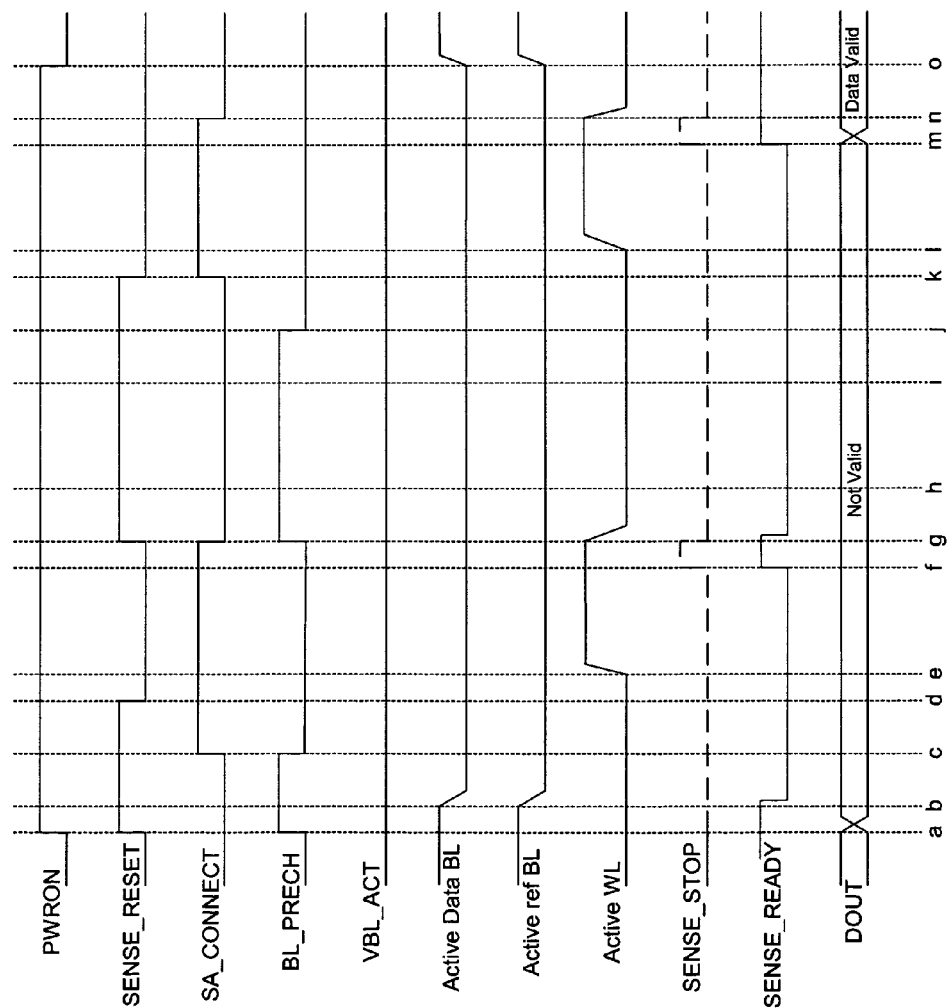
FIG. 7 shows an embodiment of a timing diagram for self-timed sneak current cancellation, in accordance with the invention.

Referring now to FIG. 7, the interaction between the self-timed sneak current cancellation and a read cycle may be better understood. Generally, a sample of the integrators is taken when VREF has reached the threshold voltage. In the dual read mode discussed with regard to FIG. 4, the second sample is taken when VREF reaches a voltage level substantially equal to the threshold voltage, similar to the taking of the first sample. The second integration may take slightly longer than the first. A read signal, SENSE_READY_OUT, is generated each time a sample is taken. In addition, there is a programmable timeout function that may cause the sample to be taken before the threshold is reached. The sample taken is of the output voltage of the integrators.

In FIG. 7, the various signals in the timing diagram are as follows. Some of these are not shown in FIG. 6, as they are control signals to the various components of the circuit and are somewhat self-explanatory.

| Signal Name | Description |
| --- | --- |
| PWRON | Power up signal |
| SENSE_RESET | Reset signal for the integrators |
| SA_CONNECT | Connect the integrators to the bit lines and the SNEAKREF module to the reference bit line |
| BL_PRECH | Precharge signal for the reference bit line |
| VBL_ACT | Voltage on the active bit line |
| Active data BL | Bit line being addressed |
| Active ref BL | Active reference bit line |
| Active WL | Word line being addressed |
| SENSE_STOP | Timeout signal |
| SENSE_READY | Signal indicating a sample is to be taken from integrators |
| DOUT | Data out |

The relevant points of time in the timing diagram are designated with a lower case letter.

At 'a' the sense amplifiers are powered up and the integrators enter their reset state. The active bit line and the reference bit line are precharged to the voltage on the VBL_ACT. At the end of 'b' the column strobe connects the data and reference bit lines to BL_DATA and BL_REF lines, respectively. At 'c' the precharge period ends and the BL_DATA and BL_REF lines are connected to the amplifiers through SA_CONNECT.

Integration starts as the integrators exit their reset state at 'd.' The addressed word line is then switched to $V_S$ to allow the full switching potential to lie across the addressed cells of the memory array at 'e.' At 'f' the sneak charge on the reference bit line has reached the threshold, or the SENSE_STOP signal is triggered by a timeout. SENSE_READY is set high and the comparator samples the output of the integrator. This ends the first integration.

At points 'g', and 'h', the process resets to allow the second sensing period to commence. At 'g' the BL_DAT and BL_REF lines are disconnected from the amplifiers and the integrators are reset. The active word line is also switched back. At 'h' VBL_ACT is switched to a dwelling voltage or left alone and BL_DAT and BL_REF follow.

The second sensing period commences at 'i' when VBL_ACT returns to its inactive state, and BL_DAT and BL_REF follow. For purposes of this discussion, and as shown in FIG. 4, the inactive state for VBL_ACT is assumed to be zero volts. However, there may be a bias voltage applied, $V_{BL}$, to which VBL_ACT is precharged. The points 'k,' 'l,' and 'm' correspond to points 'd,' 'e,' and 'f.' The process cycles down at 'n' when BL_DAT and BL_REF are disconnected from the amplifiers and the addressed word line is switched back. Finally, at 'o' the sense amplifiers power down, the column strobe turns off and the bit lines return to the quiescent voltage.

In this manner the sneak current is first collected by self-timing the integration periods to allow the VREF to reach a predetermined level. Since VREF includes the sneak current, the possibility of a false reading is mitigated. The results of the two sensing operations are subtracted to ensure that all influences of the sneak current are eliminated.

Thus, although there has been described to this point a particular embodiment for a method and apparatus for self-timed sneak current cancellation, it is not intended that such specific references be considered as limitations upon the scope of this invention except in-so-far as set forth in the following claims.

What is claimed is:

1. A timing circuit, comprising:
   a control module to decode command signals and generate control signals based upon those command signals;
   a voltage generator to generate a threshold voltage signal in response to the control signals;
   an amplifier to amplify a reference voltage signal; and
   a comparator to detect when the reference voltage becomes substantially equal to the threshold voltage and to generate a read out signal.

2. The timing circuit of claim 1, wherein the amplifier further comprises a pre-amplifier.

3. The timing circuit of claim 1, wherein the timing circuit further comprises a timeout timer to generate a timeout signal, wherein the timeout signal causes the comparator to generate the read out signal regardless of the level of the reference voltage.

4. The timing circuit of claim 1, wherein the threshold voltage signal is adaptively adjustable.

5. The timing circuit of claim 1, wherein the threshold voltage signal is adjustable by the user.

6. A system, comprising:
   a timing circuit, comprising:
      a control module to decode command signals and generate control signals based upon those command signals;
      a voltage generator to generate a threshold voltage signal in response to the control signals;
      an amplifier to amplify a reference voltage signal; and
      a comparator to detect when the reference voltage becomes substantially equal to the threshold voltage and to generate a read out signal; and
   a memory array to receive the read out signal.

7. The system of claim 6, wherein the amplifier further comprises a pre-amplifier.

8. The system of claim 6, wherein the timing circuit further comprises a timeout timer to generate a timeout signal, wherein the timeout signal causes the comparator to generate the read out signal regardless of the level of the reference voltage.

9. A method of timing signals, comprising:
   decoding command signals and generating control signals based upon those command signals at a control module;
   generating a threshold voltage signal in response to the control signals at a voltage generator;
   amplifying a reference voltage signal; and
   comparing the threshold voltage signal to the reference voltage signal at a comparator to detect when the reference voltage becomes substantially equal to the threshold voltage and to generate a read out signal.

10. The method of claim 9, the method further comprising generating a timeout signal, wherein the timeout signal causes the comparator to generate the read out signal regardless of the level of the reference voltage.

11. The method of claim 9, wherein generating the threshold voltage signal further comprises generating an adaptively adjustable threshold signal.

12. The method of claim 9, wherein generating the threshold voltage signal further comprises allowing a user to adjust the threshold voltage signal.

* * * * *